(12) United States Patent
Kim (10) Patent No.: US 11,551,780 B2
(45) Date of Patent: Jan. 10, 2023

(54) SEMICONDUCTOR APPARATUS (71) Applicant: SK hynix Inc., Icheon-si (KR)

(72) Inventor: Dong Keun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/996,005

(22) Filed: Jun. 1, 2018

(65) Prior Publication Data

US 2019/0189240 A1 Jun. 20, 2019

(30) Foreign Application Priority Data

Dec. 19, 2017 (KR) .................. 10-2017-0174974

(51) Int. Cl.
*G11C 16/06* (2006.01)
*G11C 29/00* (2006.01)
*G11C 29/44* (2006.01)
*G11C 29/24* (2006.01)

(52) U.S. Cl.
CPC ............ *G11C 29/785* (2013.01); *G11C 29/44* (2013.01); *G11C 29/24* (2013.01)

(58) Field of Classification Search
CPC ........ G11C 29/785; G11C 29/44; G11C 29/24
See application file for complete search history.

(56) References Cited

U.S. PATENT DOCUMENTS

| | | | |
|---|---|---|---|
| 5,742,547 A | 4/1998 | Lee | |
| 6,259,636 B1 * | 7/2001 | Fukuda | G11C 29/808 365/200 |
| 2003/0110348 A1 * | 6/2003 | Janzen | G11C 7/1033 711/105 |
| 2010/0074039 A1 * | 3/2010 | Kondo | G11C 29/846 365/200 |
| 2013/0070547 A1 * | 3/2013 | Pyeon | G11C 29/44 365/200 |
| 2013/0117602 A1 | 5/2013 | Kim et al. | |
| 2013/0117636 A1 * | 5/2013 | Kim | G11C 29/04 714/773 |
| 2013/0182517 A1 * | 7/2013 | Kong | G11C 29/44 365/200 |
| 2015/0043288 A1 * | 2/2015 | Kim | G11C 17/14 365/189.05 |
| 2016/0300627 A1 * | 10/2016 | You | G11C 29/76 |
| 2017/0133108 A1 * | 5/2017 | Lee | G11C 29/76 |
| 2018/0090227 A1 * | 3/2018 | Lee | G11C 8/10 |

FOREIGN PATENT DOCUMENTS

| | | |
|---|---|---|
| CN | 1618104 A | 5/2005 |
| KR | 1019990045587 A | 6/1999 |
| KR | 1020080006113 A | 1/2008 |
| KR | 101282967 B1 | 7/2013 |
| KR | 1020140078292 A | 6/2014 |
| KR | 1020150018106 A | 2/2015 |

* cited by examiner

*Primary Examiner* — Uyen Smet
(74) *Attorney, Agent, or Firm* — William Park & Associates Ltd.

(57) ABSTRACT

A semiconductor apparatus may include a repair circuit configured to activate a redundant line of a cell array region by comparing repair information and address information. The semiconductor apparatus may include a main decoder configured to perform a normal access to the cell array region by decoding the address information. The address information may include both column information and row information.

8 Claims, 12 Drawing Sheets

SEMICONDUCTOR APPARATUS

CROSS-REFERENCES TO RELATED APPLICATION

The present application claims priority under 35 U.S.C. § 119(a) to Korean patent application number 10-2017-0174974 filed on Dec. 19, 2017 in the Korean Intellectual Property Office, which is incorporated herein by reference in its entirety.

BACKGROUND

1. Technical Field

Various embodiments relate generally to a semiconductor apparatus and, more particularly, to repairing failed components in a semiconductor apparatus.

2. Related Art

A semiconductor apparatus can detect failed memory cells (or simply "failed cells") via testing its entire memory cell array.

A repair information refers to the address(es) for accessing the failed cell(s).

The repair information is generally stored in a fuse array at one or more units of "fuse sets."

A problem may arise during a semiconductor apparatus operation if an input address requires accessing a failed cell, but this problem can be solved by allocating a redundant memory cell (or a redundant cell) that can be accessed instead of the failed cell.

Storing the repair information and accessing the redundant cell allocated instead of the failed cell are referred to as a repair operation.

Since the number of redundant cells is limited, it is important to perform the repair operation by efficiently using the redundant cells.

SUMMARY

In an embodiment, a semiconductor apparatus may include a repair circuit configured to activate a redundant line of a cell array region by comparing repair information and address information. The semiconductor apparatus may include a main decoder configured to perform a normal access to the cell array region by decoding the address information. The address information may include both column information and row information.

In an embodiment, a semiconductor apparatus may include a cell array region including normal word lines, redundant word lines, normal bit lines and redundant bit lines. The semiconductor apparatus may include a first repair circuit configured to selectively activate the redundant bit lines by comparing first repair information and first address information. Each of the redundant bit lines may be divided into at least two parts which are selectively activated.

DETAILED DESCRIPTION

Hereinafter, a semiconductor apparatus will be described below with reference to the accompanying drawings through various examples of embodiments.

Various embodiments may be directed to a semiconductor apparatus capable of an efficient repair operation.

Figure 1:
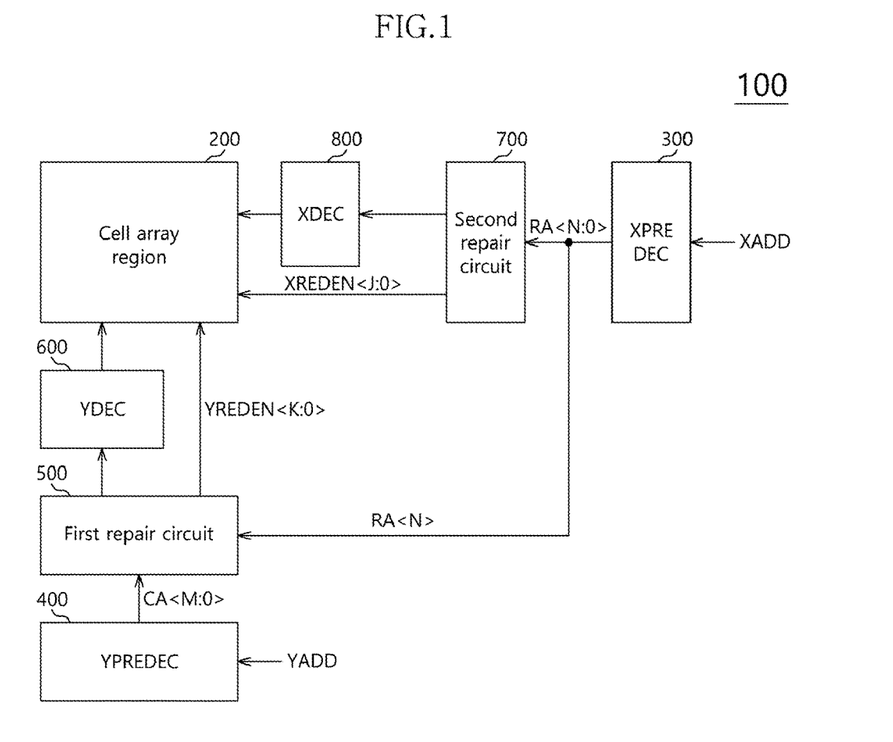
FIG. 1 is a diagram illustrating a representation of an example of the configuration of a semiconductor apparatus in accordance with an embodiment.

FIG. 1 is a diagram illustrating a representation of an example of the configuration of a semiconductor apparatus 100 in accordance with an embodiment.

Referring to FIG. 1, the semiconductor apparatus 100 in accordance with an embodiment may include a cell array region 200, a row pre-decoder (XPREDEC) 300, a column pre-decoder (YPREDEC) 400, a first repair circuit 500, a column main decoder 600, a second repair circuit 700, and a row main decoder 800.

The row pre-decoder 300 may generate an internal row address (hereinafter referred to as a row address) RA<N:0> by pre-decoding a first address XADD provided from an exterior of the semiconductor apparatus 100.

The column pre-decoder 400 may generate an internal column address (hereinafter, referred to as a column address) CA<M:0> by pre-decoding a second address YADD provided from the exterior of the semiconductor apparatus 100.

The first repair circuit 500 may generate a column redundant control signal YREDEN<K:0> for a redundant column access, by using already stored repair information, column information (i.e., a column address) and row information (i.e., a specified bit of a row address). In an embodiment, address information may include column information and row information.

The first repair circuit 500 may generate the column redundant control signal YREDEN<K:0> by comparing repair information, a specified bit, for example, the most significant bit (MSB) RA<N>, of the row address RA<N:0> and the column address CA<M:0>.

The redundant column access may include an operation of activating a redundant bit line which is coupled with a redundant memory cell of the cell array region 200.

The first repair circuit 500 may block the column address CA<M:0> from being supplied to the column main decoder (YDEC) 600 depending on the column redundant control signal YREDEN<K:0>.

The first repair circuit 500 may block the column address CA<M:0> from being supplied to the column main decoder (YDEC) 600, when any one bit of the column redundant control signal YREDEN<K:0> is activated. In an embodiment, the first repair circuit 500 may block the column address CA<M:0> from being supplied to the column main decoder (YDEC) 600 based on the row address RA<N:0>, the column address CA<M:0>, repair information, or any combination thereof.

The column main decoder 600 may perform a normal column access of activating a bit line which is coupled with a normal memory cell of the cell array region 200, by decoding the column address CA<M:0>.

The second repair circuit 700 may generate a row redundant control signal XREDEN<J:0> for a redundant row access, by comparing already stored repair information and the row address RA<N:0>. In an embodiment, a repair circuit may include anyone of a first repair circuit and a second repair circuit, or may include both a first repair circuit and a second repair circuit.

The redundant row access may include an operation of activating a redundant word line which is coupled with a redundant memory cell of the cell array region 200.

The row main decoder 800 may perform a normal row access of activating a word line which is coupled with a normal memory cell of the cell array region 200, by decoding the row address RA<N:0>. In an embodiment, a main decoder may include anyone of a column main decoder and a row main decoder, or may include both a column main decoder and a row main decoder.

Figure 2:
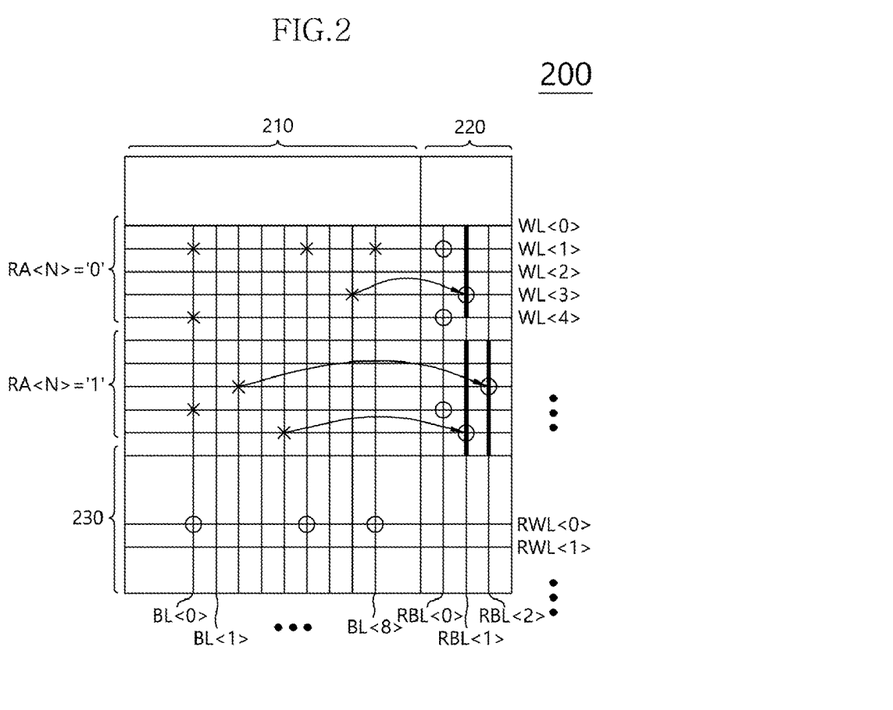
FIG. 2 is a representation of an example of a diagram to assist in the explanation of the configuration of a cell array region and a repair operation in accordance with the embodiment.

FIG. 2 is a representation of an example of a diagram to assist in the explanation of the configuration of the cell array region 200 and a repair operation in accordance with an embodiment.

Referring to FIG. 2, the cell array region 200 includes a plurality of word lines and a plurality of bit lines which are disposed to intersect with each other, and memory cells are formed at respective intersections.

The plurality of word lines include normal word lines WL and redundant word lines RWL, and the plurality of bit lines include normal bit lines BL and redundant bit lines RBL.

The intersecting region of the normal word lines WL and the normal bit lines BL may be referred to as a normal cell region 210, the intersecting region of the normal word lines WL and the redundant bit lines RBL may be referred to as a column redundant cell region 220, and the intersecting region of the normal bit lines BL and the redundant word lines RWL may be referred to as a row redundant cell region 230.

In an embodiment, when repairing failed cells X with redundant cells O, each redundant bit line RBL may be used by being divided, that is, by being divided by two.

That is to say, one among the redundant bit lines RBL may be selected by using the column address CA<M:0>, and the selected one redundant bit line RBL may be used by being divided into upper and lower parts depending on the value ('1' or '0') of the most significant bit RA<N> of the row address RA<N:0>.

For example, if the value of the most significant bit RA<N> is '0,' a failed cell coupled with a normal bit line BL<7> may be repaired with a redundant cell coupled with the upper part of a redundant bit line RBL<1>, and if the value of the most significant bit RA<N> is '1,' a failed cell coupled with a normal bit line BL<4> may be repaired with a redundant cell coupled with the lower part of the redundant bit line RBL<1>.

In other words, two failed cells may be repaired with two redundant cells, respectively, which are coupled with one redundant bit line.

Figure 3:
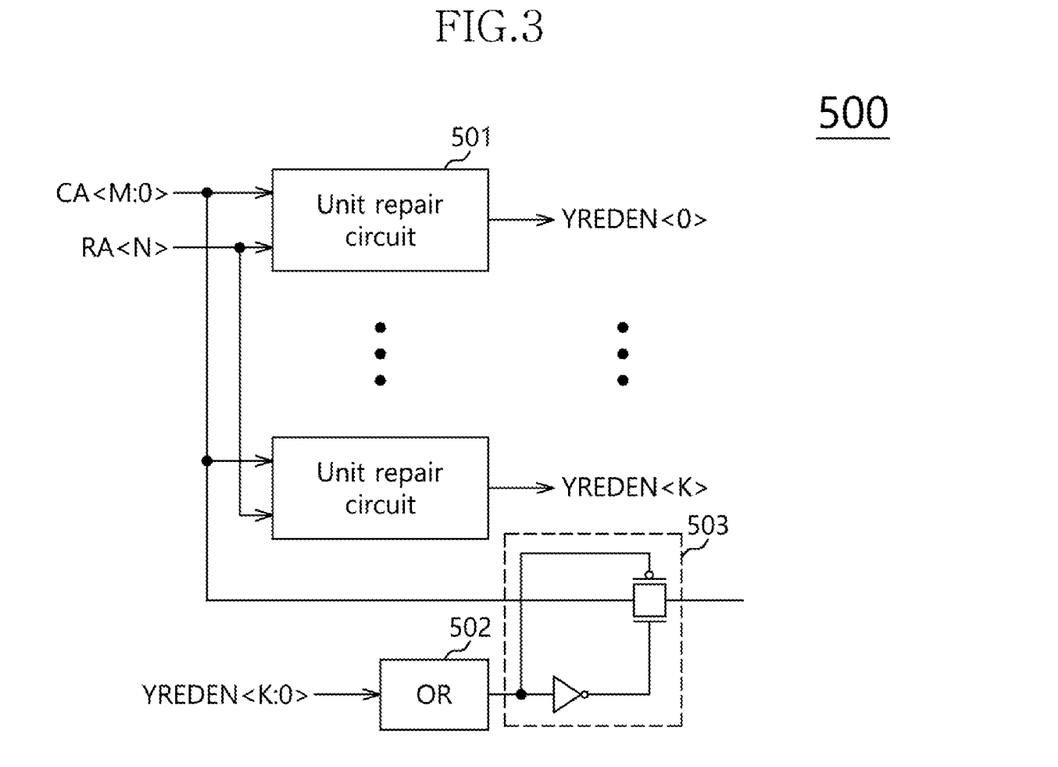
FIG. 3 is a diagram illustrating a representation of an example of the configuration of the first repair circuit shown in FIG. 1.

FIG. 3 is a diagram illustrating a representation of an example of the configuration of the first repair circuit 500 shown in FIG. 1.

Referring to FIG. 3, the first repair circuit 500 may include a plurality of unit repair circuits 501, an OR logic 502 and a switching circuit 503. In an embodiment, the OR logic 502 may be implemented with hardware, software, or any combination thereof.

The plurality of unit repair circuits 501 may be coupled one to one with the redundant bit lines RBL.

The plurality of unit repair circuits 501 may activate the redundant bit lines RBL corresponding thereto, respectively, by activating the column redundant control signal YREDEN<K:0>.

The plurality of unit repair circuits 501 may store different repair information, respectively.

The plurality of unit repair circuits 501 may generate the column redundant control signal YREDEN<K:0> by comparing the repair information already stored therein, respectively, with the most significant bit RA<N> of the row address RA<N:0> and the column address CA<M:0>.

The plurality of unit repair circuits 501 may activate bits corresponding thereto in the column redundant control signal YREDEN<K:0>, to, for example, a high level, when the repair information stored therein correspond to the most significant bit RA<N> of the row address RA<N:0> and the column address CA<M:0>.

The OR logic 502 may perform an OR logic function on the column redundant control signal YREDEN<K:0> and output an output.

The switching circuit 503 may block the column address CA<M:0> from being outputted, when the output of the OR logic 502 is, for example, a high level, that is, when any one bit of the column redundant control signal YREDEN<K:0> is activated.

Figure 4:
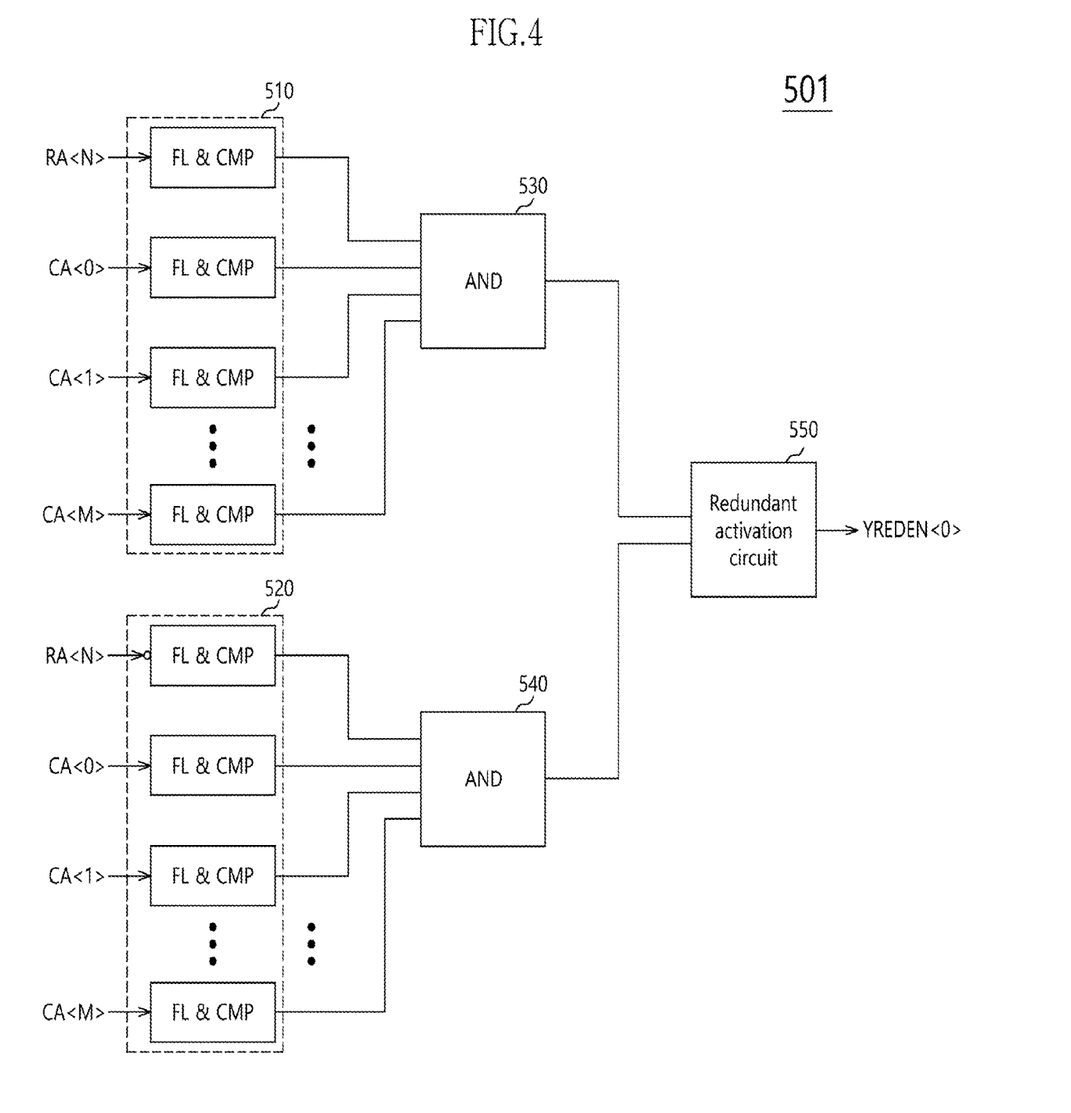
FIG. 4 is a diagram illustrating a representation of an example of the configuration of the unit repair circuit shown in FIG. 3.

FIG. 4 is a diagram illustrating a representation of an example of the configuration of the unit repair circuit 501 shown in FIG. 3.

Referring to FIG. 4, the unit repair circuit 501 may include a plurality of comparison circuits FL & CMP, AND logics (AND) 530 and 540 and a redundant activation circuit 550. In an embodiment, the AND logics 530 and 540 may be implemented with hardware, software, or any combination thereof.

The plurality of comparison circuits FL & CMP may be grouped into a first comparison circuit group 510 and a second comparison circuit group 520.

As described above with reference to FIG. 2, because there exist cases where the value of the most significant bit RA<N> of the row address RA<N:0> is '1' and '0,' in conformity with this, the plurality of comparison circuits FL & CMP are grouped into the first comparison circuit group 510 and the second comparison circuit group 520.

The first comparison circuit group 510 may compare the repair information stored in fuse latches FL with the column address CA<M:0> and the most significant bit RA<N> of the row address RA<N:0>, and may output comparison results.

The second comparison circuit group 520 may compare the repair informations stored in fuse latches FL with the column address CA<M:0> and the most significant bit RA<N> of an inverted row address RA<N:0>, and may output comparison results.

Each of the plurality of comparison circuits FL & CMP may include a fuse latch FL and a comparator CMP. In an embodiment, the comparator CMP may be implemented with hardware, software, or any combination thereof.

The fuse latch FL may read in and store therein the repair information already stored in the fuse array (not shown), in the boot-up process of the semiconductor apparatus 100.

The repair information may include an address for accessing a failed cell, that is, a failure address, and the failure address detected through a test may be programmed in the fuse array.

The comparator CMP may output, for example, a high level signal, when the repair information stored in the fuse latch FL and the address inputted thereto correspond to each other.

The AND logics 530 and 540 may perform AND logic functions on the outputs of the first comparison circuit group 510 and the second comparison circuit group 520, respectively, and may output resultant signals.

The redundant activation circuit 550 may activate the column redundant control signal YREDEN<0> to, for example, a high level, when even any one of the AND logics 530 and 540 outputs a high level signal.

Figure 5:
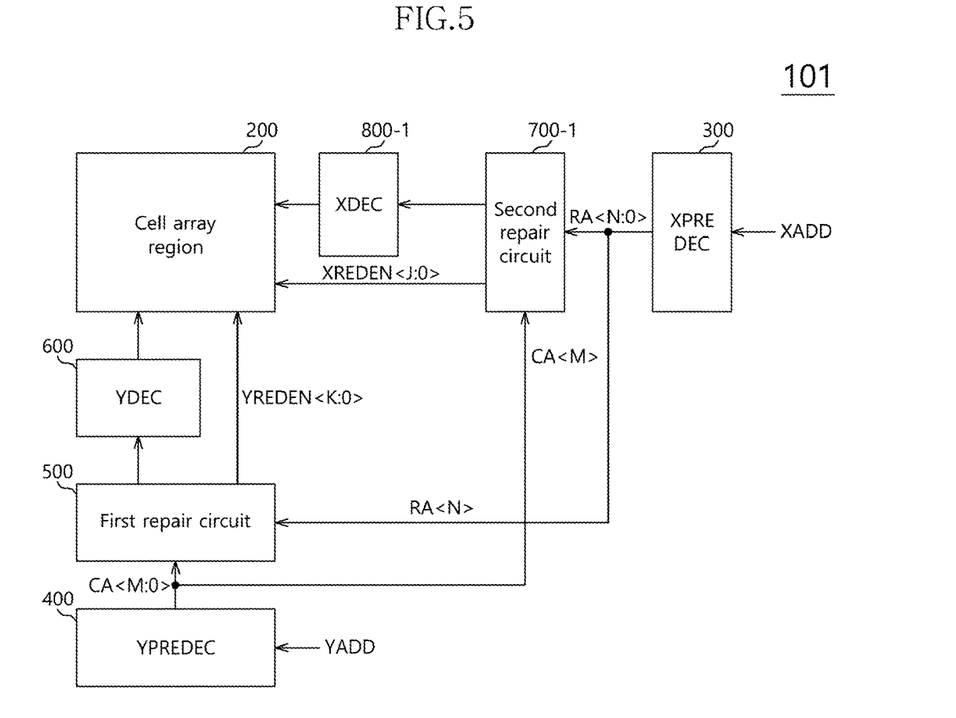
FIG. 5 is a diagram illustrating a representation of an example of the configuration of a semiconductor apparatus in accordance with another embodiment.

FIG. 5 is a diagram illustrating a representation of an example of the configuration of a semiconductor apparatus 101 in accordance with other embodiments.

Referring to FIG. 5, the semiconductor apparatus 101 in accordance with an embodiment may include a cell array region 200, a row pre-decoder 300, a column pre-decoder 400, a first repair circuit 500, a column main decoder 600, a second repair circuit 700-1 and a row main decoder 800-1.

Since the row pre-decoder 300, the column pre-decoder 400, the first repair circuit 500 and the column main decoder 600 may be configured in the same manner as in the embodiment described above with reference to FIG. 1, descriptions thereof will be omitted herein.

The second repair circuit 700-1 may generate a row redundant control signal XREDEN<J:0> for a redundant row access, by using repair information, row information (i.e., a row address) and column information (i.e., a specified bit of a column address).

The redundant row access may include an operation of activating a redundant word line which is coupled with a redundant memory cell of the cell array region 200.

The second repair circuit 700-1 may generate the row redundant control signal XREDEN<J:0> by comparing repair information, a row address RA<N:0> and the most significant bit CA<M> of a column address CA<M:0>.

The second repair circuit 700-1 may block the row address RA<N:0> from being supplied to the row main decoder (XDEC) 800-1 depending on the row redundant control signal XREDEN<J:0>.

The second repair circuit 700-1 may block the row address RA<N:0> from being supplied to the row main decoder (XDEC) 800-1, when any one bit of the row redundant control signal XREDEN<J:0> is activated. In an embodiment, the second repair circuit 700-1 may block the row address RA<N:0> from being supplied to the row main decoder (XDEC) 800-1 based on the row address RA<N:0>, the column address CA<M:0>, repair information, or any combination thereof.

The row main decoder 800-1 may perform a normal row access related with a normal memory cell of the cell array region 200, by decoding the row address RA<N:0>.

Figure 6:
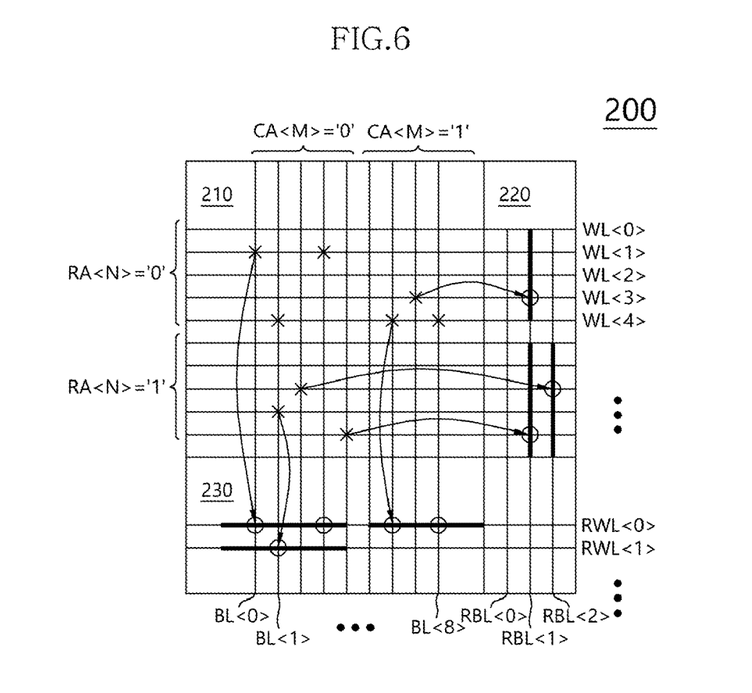
FIG. 6 is a representation of an example of a diagram to assist in the explanation of the configuration of a cell array region and a repair operation in accordance with another embodiment.

FIG. 6 is a representation of an example of a diagram to assist in the explanation of the configuration of a cell array region 200 and a repair operation in accordance with other embodiments.

Referring to FIG. 6, in the other embodiments, when repairing failed cells X with redundant cells O, each redundant bit line RBL and each redundant word line RWL may be used by being divided, that is, by being divided by two.

One among redundant bit lines RBL may be selected by using the column address CA<M:0>, and the selected one redundant bit line RBL may be used by being divided depending on the value ('1' or '0') of the most significant bit RA<N> of the row address RA<N:0>.

For example, if the value of the most significant bit RA<N> is '0,' a failed cell coupled with a normal bit line BL<7> may be repaired with a redundant cell coupled with the upper part of a redundant bit line RBL<1>, and if the value of the most significant bit RA<N> is '1,' a failed cell coupled with a normal bit line BL<4> may be repaired with a redundant cell coupled with the lower part of the redundant bit line RBL<1>.

In other words, two failed cells may be repaired with two redundant cells, respectively, which are coupled with one redundant bit line.

One among redundant word lines RWL may be selected by using the row address RA<N:0>, and the selected one redundant word line RWL may be used by being divided depending on the value of the most significant bit CA<M> of the column address CA<M:0>.

For example, if the value of the most significant bit CA<M> is '0,' a failed cell coupled with a normal word line WL<1> may be repaired with a redundant cell coupled with the left part of a redundant word line RWL<0>, and if the value of the most significant bit CA<M> is '1,' a failed cell coupled with a normal word line WL<4> may be repaired with a redundant cell coupled with the right part of the redundant word line RWL<0>.

In other words, two failed cells may be repaired with two redundant cells, respectively, which are coupled with one redundant word line.

Figure 7:
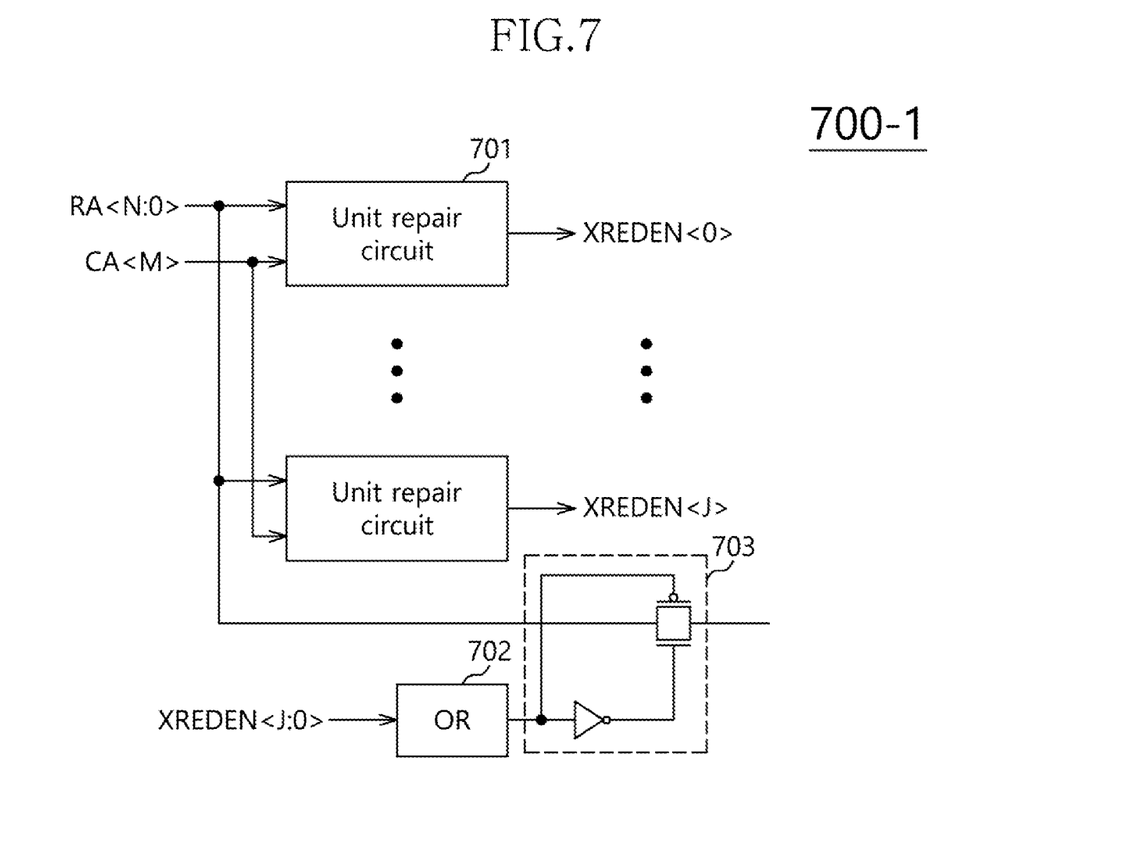
FIG. 7 is a diagram illustrating a representation of an example of the configuration of the second repair circuit shown in FIG. 5.

FIG. 7 is a diagram illustrating a representation of an example of the configuration of the second repair circuit 700-1 shown in FIG. 5.

Referring to FIG. 7, the second repair circuit 700-1 may include a plurality of unit repair circuits 701, an OR logic 702 and a switching circuit 703. In an embodiment, the OR logic 702 may be implemented with hardware, software, or any combination thereof.

The plurality of unit repair circuits 701 may be coupled one to one with the redundant word lines RWL.

The plurality of unit repair circuits 701 may activate the redundant word lines RWL corresponding thereto, respectively, by activating the row redundant control signal XREDEN<J:0>.

The plurality of unit repair circuits 701 may store different repair information, respectively.

The plurality of unit repair circuits 701 may generate the row redundant control signal XREDEN<J:0> by comparing the repair information already stored therein, respectively, with the row address RA<N:0> and the most significant bit CA<M> of the column address CA<M:0>.

The plurality of unit repair circuits 701 may activate bits corresponding thereto in the row redundant control signal XREDEN<J:0>, to a high level, when the repair information stored therein correspond to the most significant bit CA<M> of the column address CA<M:0> and the row address RA<N:0>.

The OR logic 702 may perform an OR logic function on the row redundant control signal XREDEN<J:0> and output an output.

The switching circuit 703 may block the row address RA<N:0> from being outputted, when the output of the OR logic 502 is, for example, a high level, that is, when any one bit of the row redundant control signal XREDEN<J:0> is activated.

Figure 8:
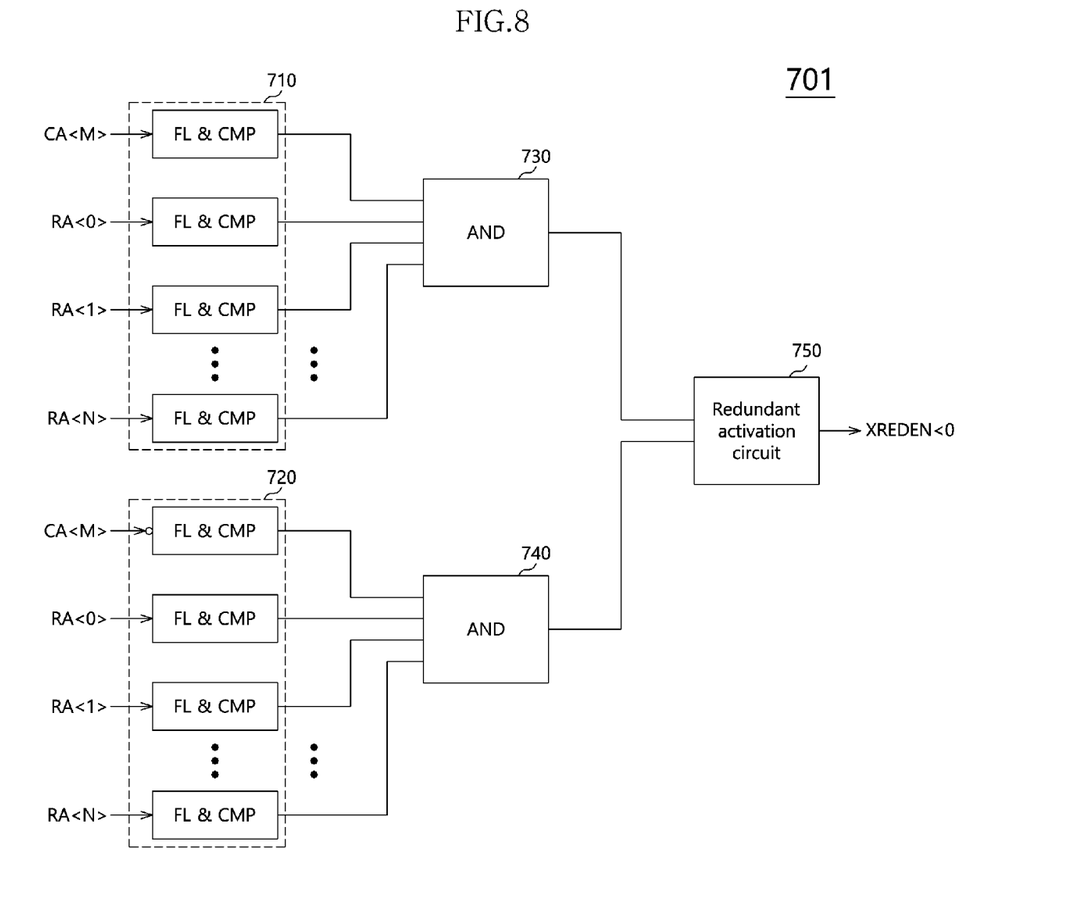
FIG. 8 is a diagram illustrating a representation of an example of the configuration of the unit repair circuit shown in FIG. 7.

FIG. 8 is a diagram illustrating a representation of an example of the configuration of the unit repair circuit 701 shown in FIG. 7.

Referring to FIG. 8, the unit repair circuit 701 may include a plurality of comparison circuits FL & CMP, AND logics (AND) 730 and 740 and a redundant activation circuit 750. In an embodiment, the AND logics 730 and 740 may be implemented with hardware, software, or any combination thereof.

The plurality of comparison circuits FL & CMP may be grouped into a first comparison circuit group 710 and a second comparison circuit group 720.

As described above with reference to FIG. 6, because there exist cases where the value of the most significant bit CA<M> of the column address CA<M:0> is '1' and '0,' in conformity with this, the plurality of comparison circuits FL & CMP are grouped into the first comparison circuit group 710 and the second comparison circuit group 720.

The first comparison circuit group 710 may compare the repair informations stored in fuse latches FL with the row address RA<N:0> and the most significant bit CA<M> of the column address CA<M:0>, and may output comparison results.

The second comparison circuit group 720 may compare the repair informations stored in fuse latches FL with the row address RA<N:0> and the most significant bit CA<M> of an inverted column address CA<M:0>, and may output comparison results.

Each of the plurality of comparison circuits FL & CMP may include a fuse latch FL and a comparator CMP, and may be configured in the same manner as the plurality of comparison circuits FL & CMP of FIG. 4.

The AND logics 730 and 740 may perform AND logic functions on the outputs of the first comparison circuit group 710 and the second comparison circuit group 720, respectively, and may output resultant signals.

The redundant activation circuit 750 may activate the row redundant control signal XREDEN<0> to, for example, a high level, when any one of the AND logics 730 and 740 outputs a high level signal.

Figure 9:
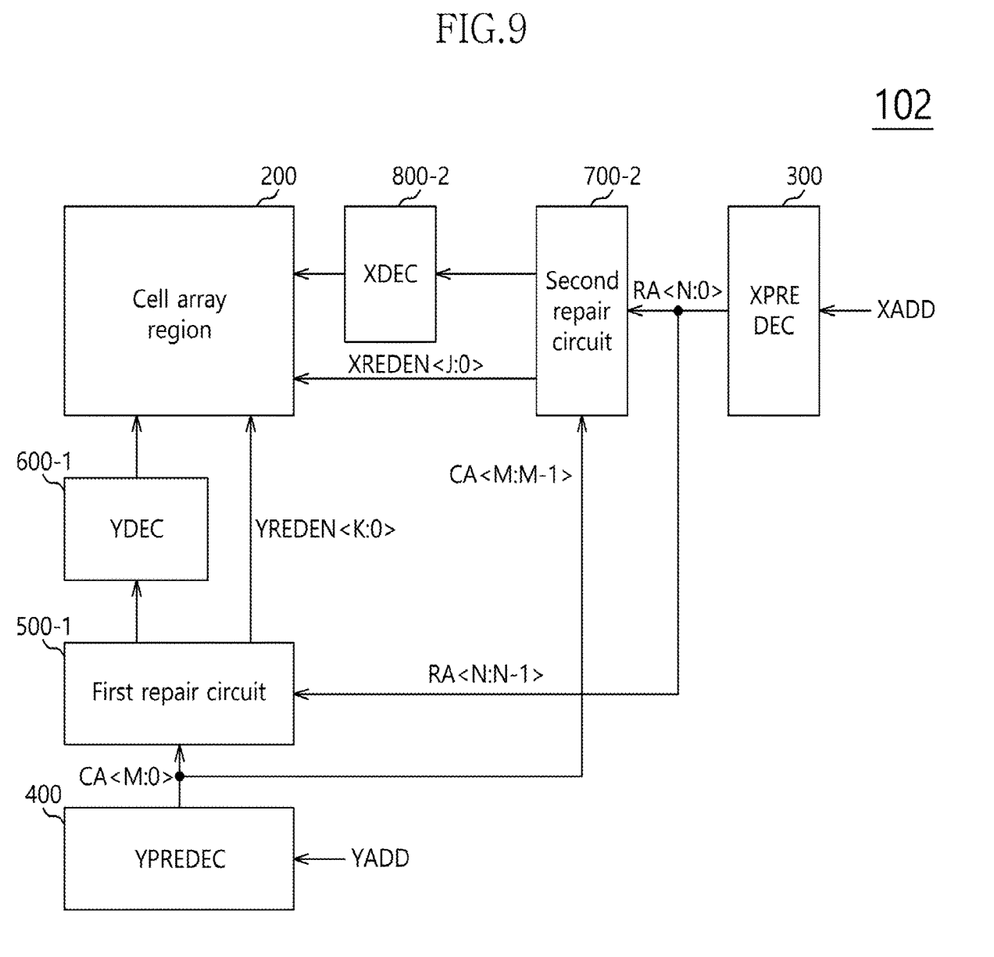
FIG. 9 is a diagram illustrating a representation of an example of the configuration of a semiconductor apparatus in accordance with still another embodiment.

FIG. 9 is a diagram illustrating a representation of an example of the configuration of a semiconductor apparatus 102 in accordance with still other embodiments.

Referring to FIG. 9, the semiconductor apparatus 102 in accordance with still other embodiments may include a cell array region 200, a row pre-decoder 300, a column pre-decoder 400, a first repair circuit 500-1, a column main decoder 600-1, a second repair circuit 700-2 and a row main decoder 800-2.

Since the row pre-decoder 300 and the column pre-decoder 400 may be configured in the same manner as in the embodiments described above with reference to FIG. 1, descriptions thereof will be omitted herein.

The first repair circuit 500-1 may generate a column redundant control signal YREDEN<K:0> for a redundant column access, by using already stored repair information, column information (i.e., a column address) and row information (i.e., specified bits of a row address).

The first repair circuit 500-1 may generate the column redundant control signal YREDEN<K:0> by comparing repair information, the upper bits RA<N:N-1> of a row address RA<N:0> and a column address CA<M:0>.

The redundant column access may include an operation of activating a redundant bit line which is coupled with a redundant memory cell of the cell array region 200.

The first repair circuit 500-1 may block the column address CA<M:0> from being supplied to the column main decoder 600-1 depending on the column redundant control signal YREDEN<K:0>. In an embodiment, the first repair circuit 500-1 may block the column address CA<M:0> from being supplied to the column main decoder 600-1 based on repair information, a row address RA<N:0>, and a column address CA<M:0>.

The first repair circuit 500-1 may block the column address CA<M:0> from being supplied to the column main decoder 600-1, when any one bit of the column redundant control signal YREDEN<K:0> is activated.

The column main decoder 600-1 may perform a normal column access of activating a bit line which is coupled with a normal memory cell of the cell array region 200, by decoding the column address CA<M:0>.

The second repair circuit 700-2 may generate a row redundant control signal XREDEN<J:0> for a redundant row access, by using repair information, row information (i.e., a row address) and column information (i.e., specified bits of a column address).

The redundant row access may include an operation of activating a redundant word line which is coupled with a redundant memory cell of the cell array region 200.

The second repair circuit 700-2 may generate the row redundant control signal XREDEN<J:0> by comparing repair information, the row address RA<N:0> and the upper bits CA<M:M-1> of the column address CA<M:0>.

The second repair circuit 700-2 may block the row address RA<N:0> from being supplied to the row main decoder 800-2 depending on the row redundant control signal XREDEN<J:0>. In an embodiment, the second repair circuit 700-2 may block the row address RA<N:0> from being supplied to the row main decoder 800-2 based on repair information, a row address RA<N:0>, and column address CA<M:0>.

The second repair circuit 700-2 may block the row address RA<N:0> from being supplied to the row main decoder 800-2, when any one bit of the row redundant control signal XREDEN<J:0> is activated.

The row main decoder 800-2 may perform a normal row access related with a normal memory cell of the cell array region 200, by decoding the row address RA<N:0>.

Figure 10:
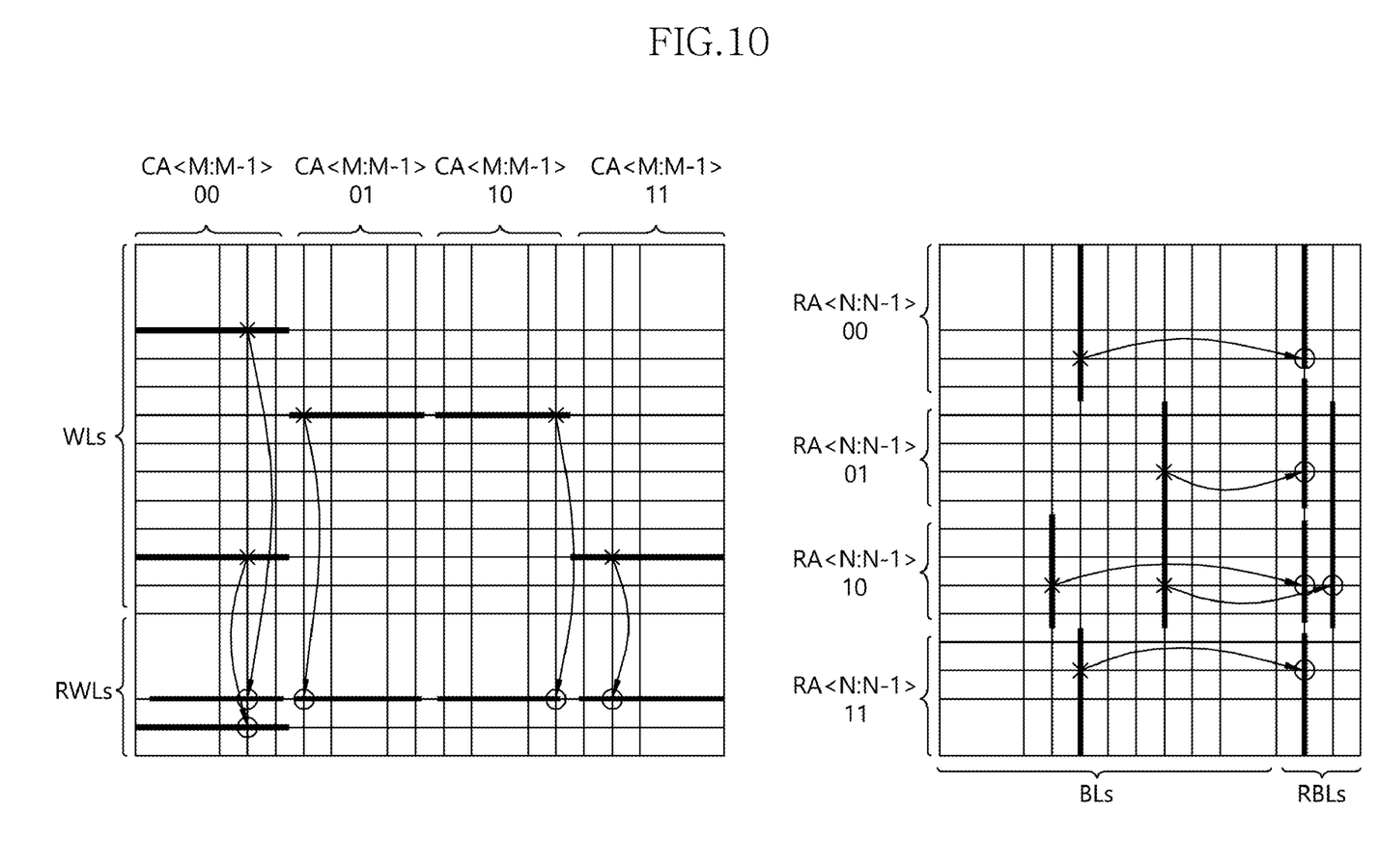
FIG. 10 is a representation of an example of a diagram to assist in the explanation of the configuration of a cell array region and a repair operation in accordance with still another embodiment.

FIG. 10 is a representation of an example of a diagram to assist in the explanation of the configuration of a cell array region 200 and a repair operation in accordance with still other embodiments.

Referring to FIG. 10, in the other embodiments, when repairing failed cells X with redundant cells O, each redundant bit line RBL and each redundant word line RWL may be used by being divided multiple times, that is, for example but not limited to, by being divided by four.

One among redundant bit lines RBL may be selected by using the column address CA<M:0>, and the selected one redundant bit line RBL may be used by being divided by four depending on the values ('00,' '01,' '10' or '11') of the upper bits RA<N:N-1> of the row address RA<N:0>.

In other words, four failed cells may be repaired with four redundant cells, respectively, which are coupled with one redundant bit line.

One among redundant word lines RWL may be selected by using the row address RA<N:0>, and the selected one redundant word line RWL may be used by being divided by four depending on the values ('00,' '01,' '10' or '11') of the upper bits CA<M:M-1> of the column address CA<M:0>.

In other words, four failed cells may be repaired with four redundant cells, respectively, which are coupled with one redundant word line.

Figure 11:
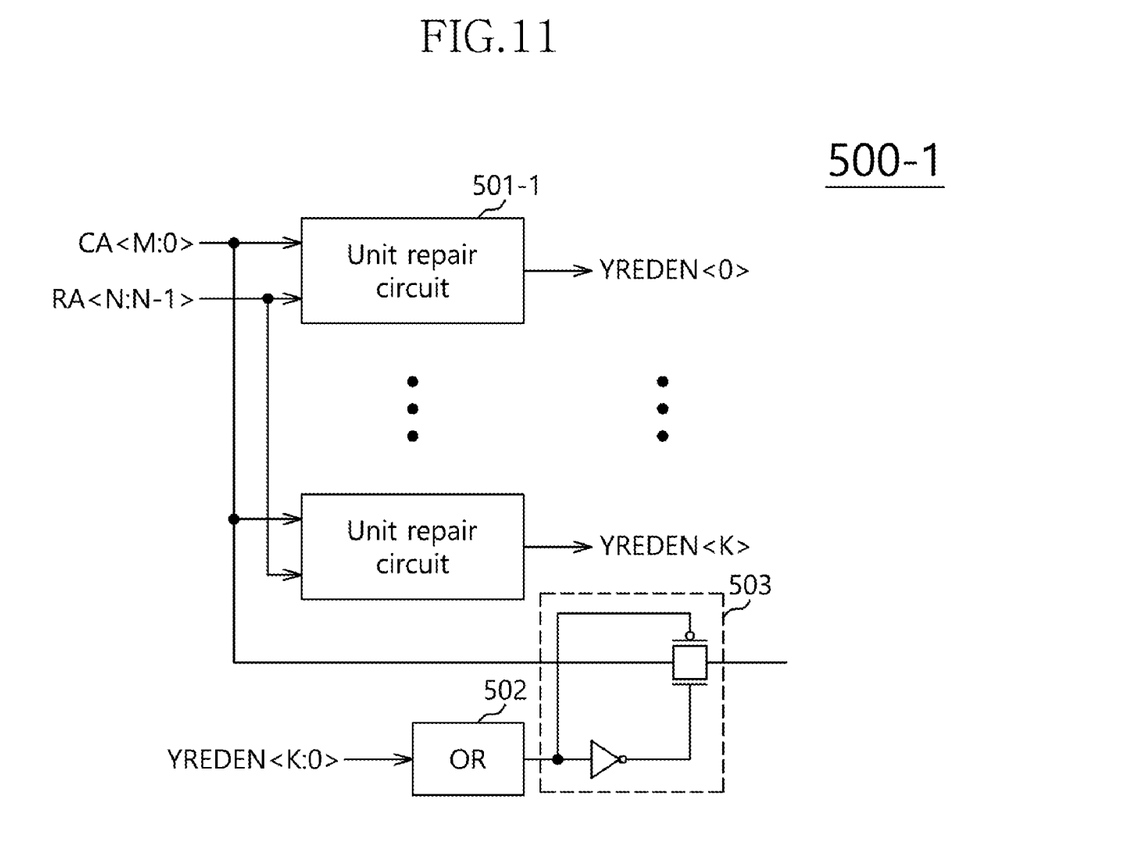
FIG. 11 is a diagram illustrating a representation of an example of the configuration of the first repair circuit shown in FIG. 9.

FIG. 11 is a diagram illustrating a representation of an example of the configuration of the first repair circuit 500-1 shown in FIG. 9.

Referring to FIG. 11, the first repair circuit 500-1 may include a plurality of unit repair circuits 501-1, an OR logic 502 and a switching circuit 503. In an embodiment, the OR logic 502 may be implemented with hardware, software, or any combination thereof.

The plurality of unit repair circuits 501-1 may be coupled one to one with the redundant bit lines RBL.

The plurality of unit repair circuits 501-1 may activate the redundant bit lines RBL corresponding thereto, respectively, by activating the column redundant control signal YREDEN<K:0>.

The plurality of unit repair circuits 501-1 may store different repair information, respectively.

The plurality of unit repair circuits 501-1 may generate the column redundant control signal YREDEN<K:0> by comparing the repair informations already stored therein, respectively, with the upper bits RA<N:N-1> of the row address RA<N:0> and the column address CA<M:0>.

The plurality of unit repair circuits 501-1 may activate bits corresponding thereto in the column redundant control signal YREDEN<K:0>, to, for example, a high level, when the repair informations stored therein correspond to the upper bits RA<N:N-1> of the row address RA<N:0> and the column address CA<M:0>.

The OR logic 502 may perform an OR logic function on the column redundant control signal YREDEN<K:0> and output an output.

The switching circuit 503 may block the column address CA<M:0> from being outputted, when the output of the OR logic 502 is, for example, a high level, that is, when any one bit of the column redundant control signal YREDEN<K:0> is activated.

Figure 12:
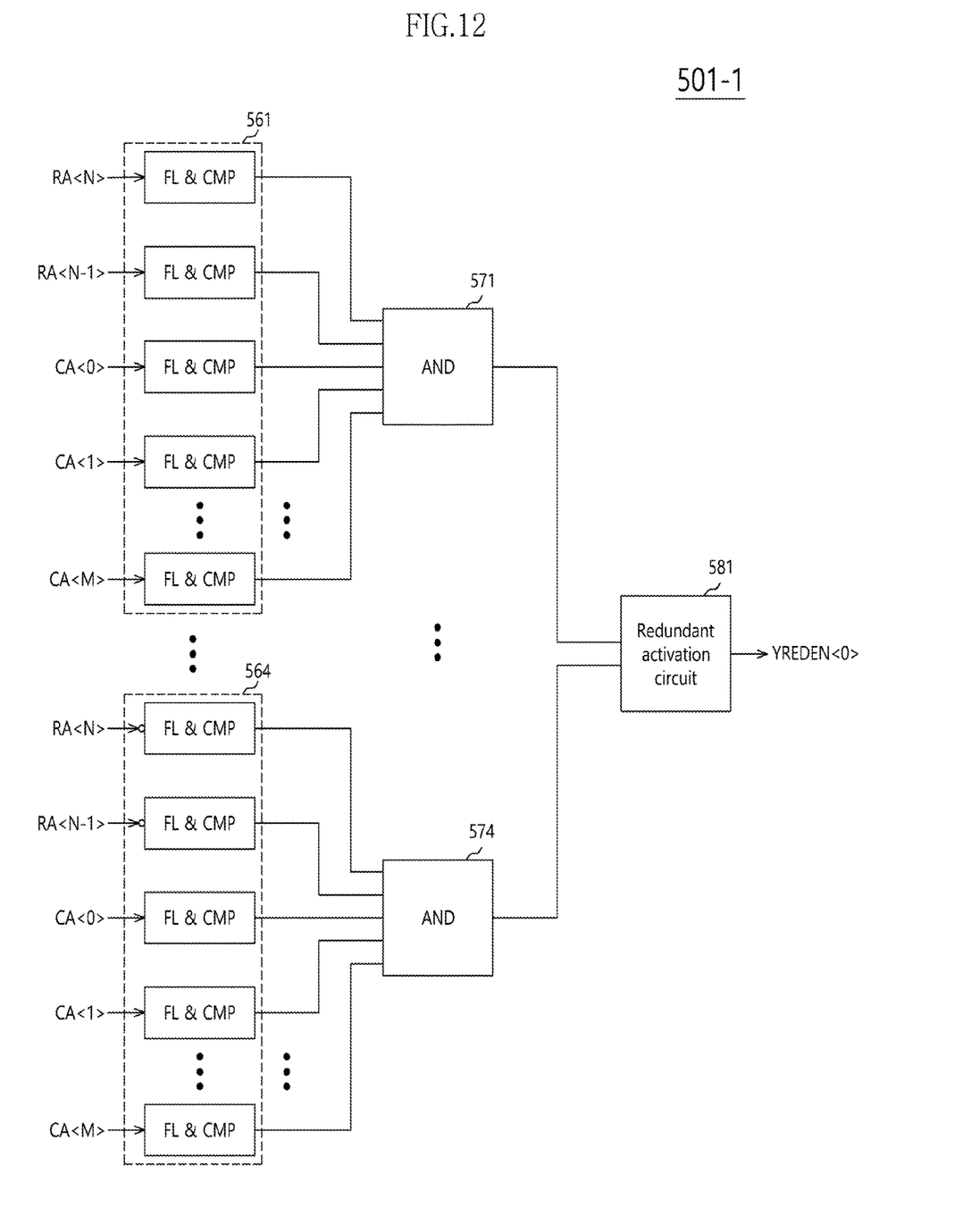
FIG. 12 is a diagram illustrating a representation of an example of the configuration of the unit repair circuit shown in FIG. 11.

FIG. 12 is a diagram illustrating a representation of an example of the configuration of the unit repair circuit 501-1 shown in FIG. 11.

Referring to FIG. 12, the unit repair circuit 501-1 may include a plurality of comparison circuits FL & CMP, AND logics (AND) 571 to 574 and a redundant activation circuit 581. In an embodiment, the AND logics 571 to 574 may be implemented with hardware, software, or any combination thereof.

The plurality of comparison circuits FL & CMP may be grouped into first to fourth comparison circuit groups 561 to 564.

As described above with reference to FIG. 10, because there exist cases where the values of the upper bits RA<N:N-1> of the row address RA<N:0> are '11,' '10,' '01' and '00,' in conformity with this, the plurality of comparison circuits FL & CMP are grouped into the first to fourth comparison circuit groups 561 to 564.

The first comparison circuit group 561 may compare the repair information stored in fuse latches FL with the column address CA<M:0> and the upper bits RA<N:N-1> of the row address RA<N:0>, and may output comparison results.

The second comparison circuit group 562 may compare the repair information stored in fuse latches FL with the column address CA<M:0>, the most significant bit RA<N> of the row address RA<N:0> and the next significant bit RA<N-1> of an inverted row address RA<N:0>, and may output comparison results.

The third comparison circuit group 563 may compare the repair information stored in fuse latches FL with the column address CA<M:0>, the next significant bit RA<N-1> of the row address RA<N:0> and the most significant bit RA<N> of the inverted row address RA<N:0>, and may output comparison results.

The fourth comparison circuit group 564 may compare the repair information stored in fuse latches FL with the column address CA<M:0> and the upper bits RA<N:N-1> of the inverted row address RA<N:0>, and may output comparison results.

Each of the plurality of comparison circuits FL & CMP may include a fuse latch FL and a comparator CMP. In an embodiment, the comparator CMP may be implemented with hardware, software, or any combination thereof.

The AND logics 571 to 574 may perform AND logic functions on the outputs of the first to fourth comparison circuit groups 561 to 564, respectively, and may output resultant signals.

The redundant activation circuit 581 may activate the column redundant control signal YREDEN<0> to, for example, a high level, when even any one of the AND logics 571 to 574 outputs a high level signal.

Figure 13:
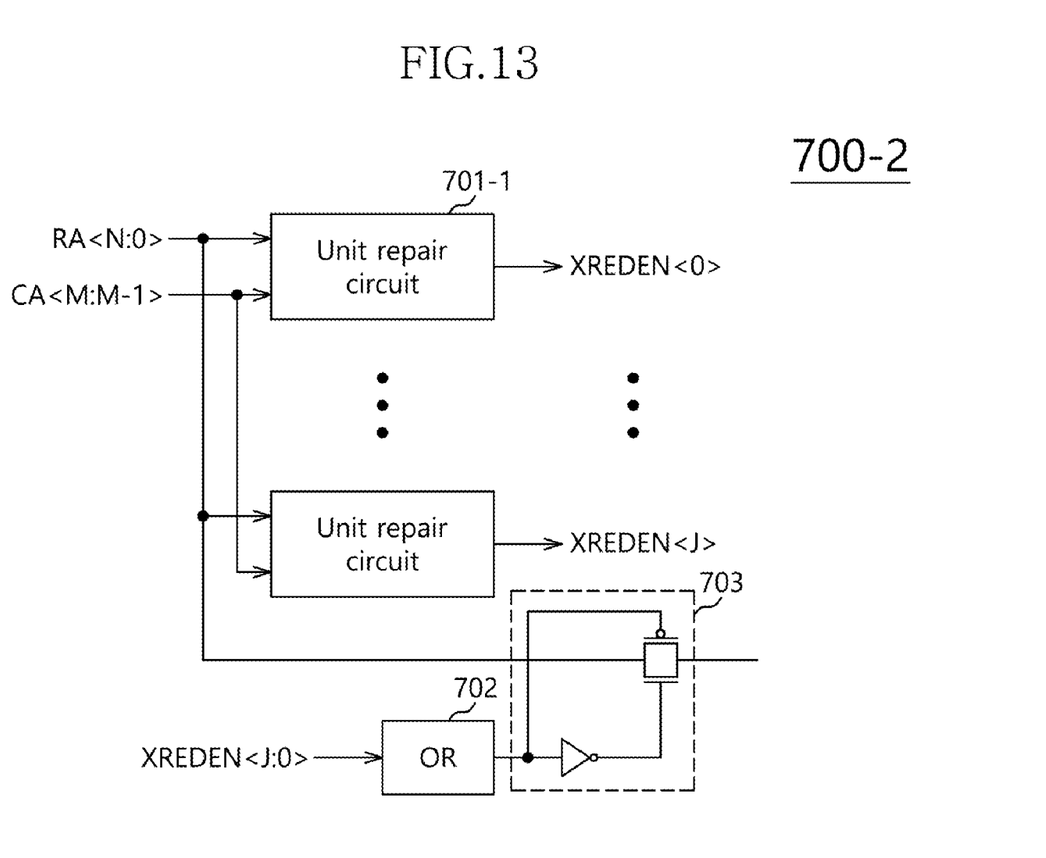
FIG. 13 is a diagram illustrating a representation of an example of the configuration of the second repair circuit shown in FIG. 9.

FIG. 13 is a diagram illustrating a representation of an example of the configuration of the second repair circuit 700-2 shown in FIG. 9.

Referring to FIG. 13, the second repair circuit 700-2 may include a plurality of unit repair circuits 701-1, an OR logic 702 and a switching circuit 703. In an embodiment, the OR logic 702 may be implemented with hardware, software, or any combination thereof.

The plurality of unit repair circuits 701-1 may be coupled one to one with the redundant word lines RWL.

The plurality of unit repair circuits 701-1 may activate the redundant word lines RWL corresponding thereto, respectively, by activating the row redundant control signal XREDEN<J:0>.

The plurality of unit repair circuits 701-1 may store different repair information, respectively.

The plurality of unit repair circuits 701-1 may generate the row redundant control signal XREDEN<J:0> by comparing the repair informations already stored therein, respectively, with the row address RA<N:0> and the upper bits CA<M:M-1> of the column address CA<M:0>.

The plurality of unit repair circuits 701-1 may activate bits corresponding thereto in the row redundant control signal XREDEN<J:0>, to a high level, when the repair informations stored therein correspond to the upper bits CA<M:M-1> of the column address CA<M:0> and the row address RA<N:0>.

The OR logic 702 may perform an OR logic function on the row redundant control signal XREDEN<J:0> and output an output.

The switching circuit 703 may block the row address RA<N:0> from being outputted, when the output of the OR logic 502 is, for example, a high level, that is, when any one bit of the row redundant control signal XREDEN<J:0> is activated.

Figure 14:
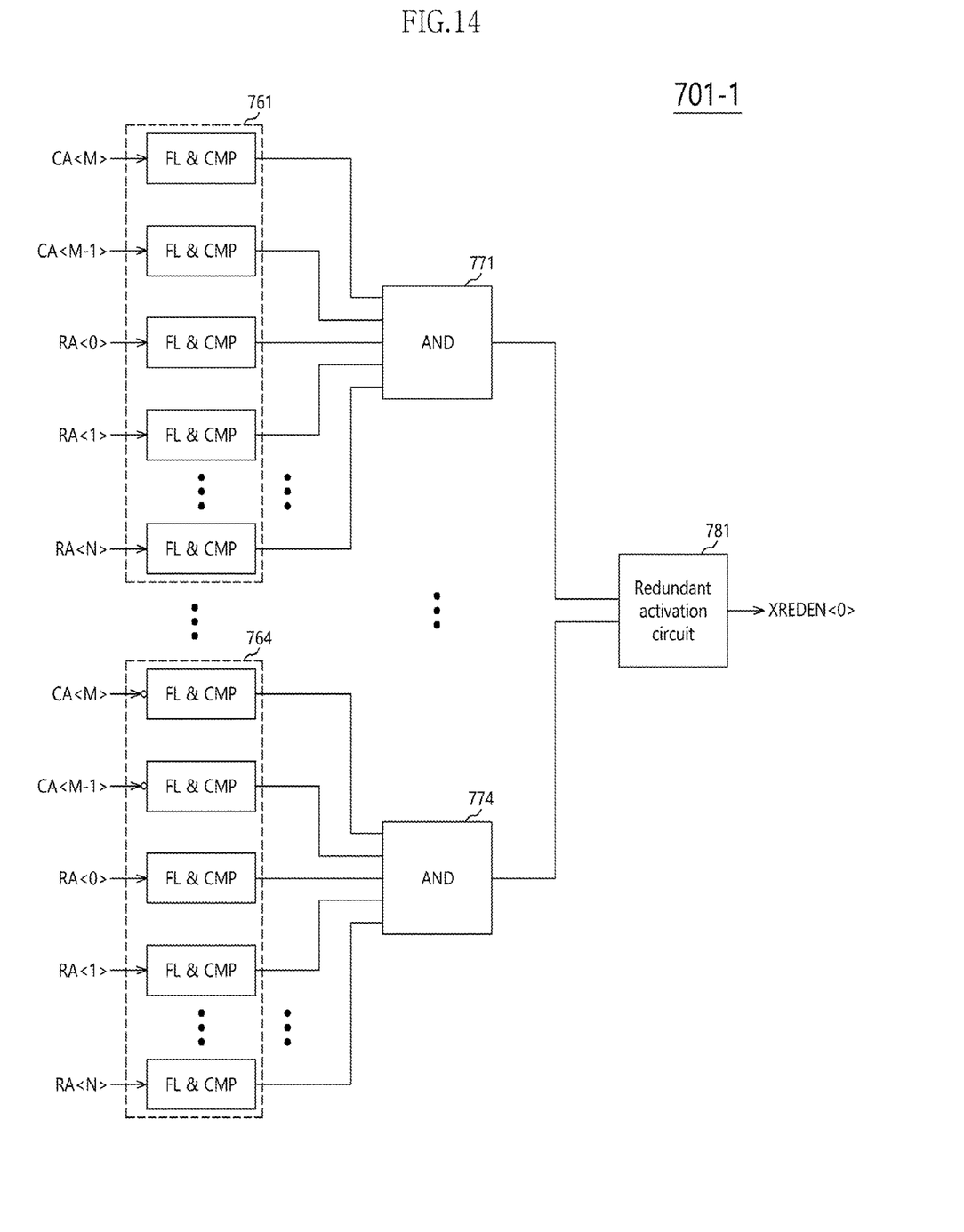
FIG. 14 is a diagram illustrating a representation of an example of the configuration of the unit repair circuit shown in FIG. 13.

FIG. 14 is a diagram illustrating a representation of an example of the configuration of the unit repair circuit 701-1 shown in FIG. 13.

Referring to FIG. 14, the unit repair circuit 701-1 may include a plurality of comparison circuits FL & CMP, AND logics (AND) 771 to 774 and a redundant activation circuit 781. In an embodiment, the AND logics 771 to 774 may be implemented with hardware, software, or any combination thereof.

The plurality of comparison circuits FL & CMP may be grouped into first to fourth comparison circuit groups 761 to 764.

As described above with reference to FIG. 10, because there exist cases where the values of the upper bits CA<M:M-1> of the column address CA<M:0> are '11,' '10,' '01' and '00,' in conformity with this, the plurality of comparison circuits FL & CMP are grouped into the first to fourth comparison circuit groups 761 to 764.

The first comparison circuit group 761 may compare the repair information stored in fuse latches FL with the row address RA<N:0> and the upper bits CA<M:M-1> of the column address CA<M:0>, and may output comparison results.

The second comparison circuit group 762 may compare the repair information stored in fuse latches FL with the row address RA<N:0>, the most significant bit CA<M> of the column address CA<M:0> and the next significant bit CA<M-1> of an inverted column address CA<M:0>, and may output comparison results.

The third comparison circuit group 763 may compare the repair information stored in fuse latches FL with the row address RA<N:0>, the next significant bit CA<M-1> of the column address CA<M:0> and the most significant bit CA<M> of the inverted column address CA<M:0>, and may output comparison results.

The fourth comparison circuit group 764 may compare the repair information stored in fuse latches FL with the row address RA<N:0> and the upper bits CA<M:M-1> of the inverted column address CA<M:0>, and may output comparison results.

Each of the plurality of comparison circuits FL & CMP may include a fuse latch FL and a comparator CMP.

The AND logics 771 to 774 may perform AND logic functions on the outputs of the first to fourth comparison circuit groups 761 to 764, respectively, and may output resultant signals.

The redundant activation circuit 781 may activate the row redundant control signal XREDEN<0> to, for example, a high level, when even any one of the AND logics 771 to 774 outputs a high level signal.

While various embodiments have been described above, it will be understood to those skilled in the art that the embodiments described are examples only. Accordingly, the semiconductor apparatus described herein should not be limited based on the described embodiments.

What is claimed is:

1. A semiconductor apparatus comprising:
a first repair circuit configured to activate a redundant bit line of a cell array region by comparing a column address and a specified bit of a row address with a first repair information to repair only a column in the cell array region, the repair information comprising an address for accessing a failed cell, the repair information being stored in fuse latches bit by bit; and
a first main decoder configured to perform a normal access to the cell array region by decoding the column address,
wherein the specified bit is less than all of the bits of the row address.

2. The semiconductor apparatus according to claim 1, wherein the first repair information is stored within the first repair circuit and the column address and the row address are received externally from the first repair circuit.

3. The semiconductor apparatus according to claim 1, wherein the specified bit of the row address is a most significant bit of the row address.

4. The semiconductor apparatus according to claim 1, wherein the first repair circuit is configured to block the column address from being supplied to the first main decoder by comparing the column address and the specified bit of the row address with the first repair information.

5. The semiconductor apparatus according to claim 1, further comprising:
a second repair circuit configured to activate a redundant word line of the cell array region by comparing the row address and a specified bit of the column address with a second repair information to repair only a row in the cell array region, and
a second main decoder configured to perform a normal access to the cell array region by decoding the row address.

6. The semiconductor apparatus according to claim 5, wherein the second repair circuit is configured to block the row address from being supplied to the second main decoder by comparing the row address and the specified bit of the column address with the second repair information.

7. The semiconductor apparatus according to claim 5, wherein the specified bit of the column address is a most significant bit of the column address.

8. The semiconductor apparatus according to claim 5, wherein the second repair information is stored within the second repair circuit and the column address and the row address are received externally from the second repair circuit.

* * * * *